United States Patent [19]

Borth et al.

[11] Patent Number: 5,392,300
[45] Date of Patent: Feb. 21, 1995

[54] DUAL MODE RADIO COMMUNICATION UNIT

[75] Inventors: David E. Borth, Palatine; John R. Haug, Arlington Heights; Phillip D. Rasky, Buffalo Grove; Gregory M. Chiasson, Barrington, all of Ill.

[73] Assignee: Motorola, Inc., Schaumburg, Ill.

[21] Appl. No.: 973,896

[22] Filed: Nov. 10, 1992

[51] Int. Cl.[6] .............................................. G06F 11/10
[52] U.S. Cl. .................................. 371/37.7; 371/38.1; 371/43
[58] Field of Search ...................... 371/35, 37.2, 37.7, 371/38.1, 43, 44

[56] References Cited

U.S. PATENT DOCUMENTS

| 4,745,632 | 5/1988 | Duffy . | |
|---|---|---|---|
| 4,802,169 | 1/1989 | Suzuki et al. | 371/37.2 |
| 4,989,230 | 1/1991 | Gillig et al. . | |
| 5,097,507 | 3/1992 | Zinser et al. | 371/37.7 |
| 5,127,042 | 6/1992 | Gillig et al. . | |

OTHER PUBLICATIONS

Parsons, Jr., Raymond D., "Polar Quantizing for Coded PSK Transmission", *IEEE Transactions on Communication*, vol. 38, No. 9, Sep. 1990, pp. 1511–1519.

Ariyavisitakul Sirikiat, "Equalization of a Hard-Limited Slowly-Fading Multipath Signal Using a Phase Equalizer with Time-Reversal Structure", *IEEE Journal on Selected Areas in Communications*, vol. 10, No. 3, Apr. 1992, pp. 589–598.

Bellcore, Generic Criteria for Version 0.1 Wireless Access Communications Systems (WACS), Technical Advisory, TA-NWT-001313, Issue 1, Jul. 1992.

*Primary Examiner*—Vincent P. Canney
*Attorney, Agent, or Firm*—Shawn B. Dempster; Kevin A. Buford

[57] ABSTRACT

A dual mode radio communication unit for a digital communication system is provided having an error controller including an error detection encoder and a forward error correction encoder which encode an input information signal into an error protected data bit stream. In addition, the communication unit includes a mode selector which enables either the error detection encoder or the forward error correction encoder used with a particular mode of operation of the communication unit. Further, a corresponding dual mode radio communication unit is provided having an error controller for generating estimated information signal samples according to a group of algorithms consisting of either an error detection algorithm or an error correction algorithm. In addition, the corresponding communication unit includes a mode selector for receiving a signal according to a particular one of the group of algorithms which is associated with a particular mode of operation of the corresponding communication unit.

18 Claims, 6 Drawing Sheets

DUAL MODE RADIO COMMUNICATION UNIT

RELATED INVENTIONS

The present invention is related to the following inventions which are assigned to the assignee of the present invention:

Dual Mode Communication Network by Morton Stern et al. having U.S. Ser. No. 07/906,785, and filed on Jun. 30, 1992.

Method Of Registering/Reassigning A Call In A Dual Mode Communication Network by Borth et al. having U.S. Ser. No. 07/956,122, and filed on Oct. 7, 1992.

A Frequency Hopping Code Division Multiple Access Radio Communication Unit by Chiasson et al. having U.S. Ser. No. 07/973,352 and filed on Nov. 9, 1992.

FIELD OF THE INVENTION

The present invention relates to radio communication systems and, more particularly, to a dual mode radio communication unit.

BACKGROUND OF THE INVENTION

Cellular radio communication systems typically include a number of central communication base sites. Each central communication site has a service area coverage for servicing mobile communication units within the service area. The service areas typically are arranged such that adjacent remote base site service coverage areas overlap in a manner that provides a substantially continuous service region. The substantially continuous service region provides uninterrupted service by handing off mobile communication units from one base site serving a service area to an adjacent base site serving another service area.

Pedestrian as well as mobile users will typically access the same cellular radio communication systems. For purposes of this discussion, a pedestrian user is one who roams slowly (10 kph, kilometers per hour, or less) as opposed to a mobile user (up to 100 kph or more) user. However, these cellular communication systems are typically designed to provide adequate performance for the worst case environment (i.e., the mobile user). As such, the cellular radio communication systems typically provide continual overhead measurements used by the system to maintain channel quality or perform hand-off functions. Since these measurements require the same amount of processing whether a user is a mobile user or a pedestrian user, the pedestrian user is charged the same fee for using their cellular phone as the user who is a mobile user.

Therefore, there exists a need in the industry for a personal communication system (PCS) which would provide a low tier system for pedestrian users at a reduced cost. The low tier system would provide access via radio frequency (RF) link to a basic cellular network which may or may not provide hand-off capability between low tier service areas. In addition, a high tier system should be provided for the mobile user. This high tier system would have many of the features found in current cellular systems including hand-off between high tier service areas.

In order to avoid the necessity of having two separate radio communication units to operate in the low and high tier communication system, respectively, it is desirable to provide a dual mode radio communication unit capable of operating in either the low tier or high tier communication unit. In addition, it is desirable to design the dual mode radio communication unit to utilize shared components which may be used in both low and high tier operational modes of the communication unit.

SUMMARY OF THE INVENTION

A dual mode radio communication unit for a digital communication system is provided having an error controller including an error detection encoder and a forward error correction encoder which encode an input information signal into an error protected data bit stream. In addition, the communication unit includes a mode selector which enables either the error detection encoder or the forward error correction encoder used with a particular mode of operation of the communication unit. Further, a corresponding dual mode radio communication unit is provided having an error controller for generating estimated information signal samples according to a group of algorithms consisting of either an error detection algorithm or an error correction algorithm. In addition, the corresponding communication unit includes a mode selector for receiving a signal according to a particular one of the group of algorithms which is associated with a particular mode of operation of the corresponding communication unit.

DETAILED DESCRIPTION

Figure 1:
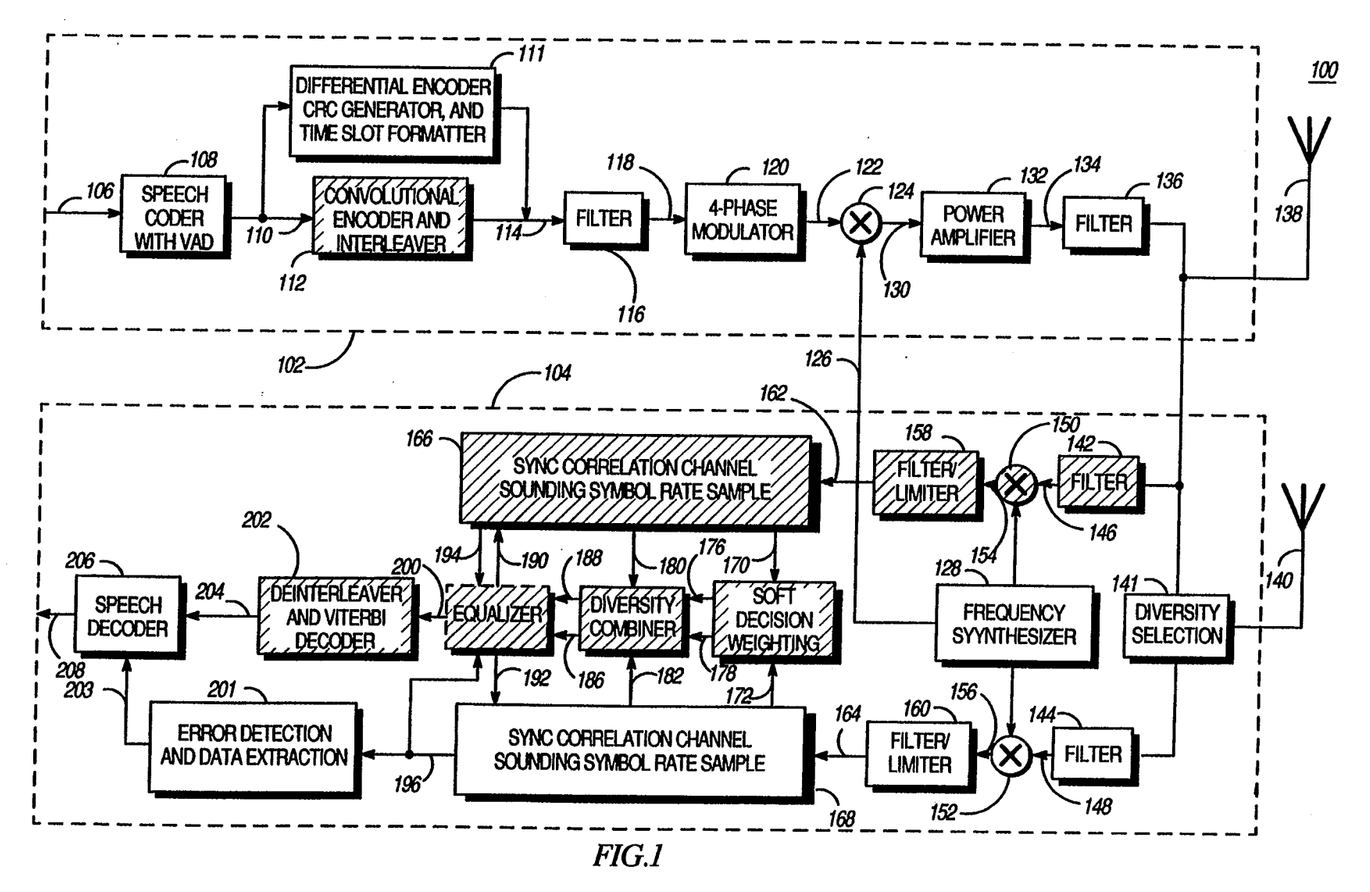
FIG. 1, 2 are diagrams showing a preferred embodiment digital cellular radio communication unit for operation in a first and a second mode, respectively.
Figure 2:
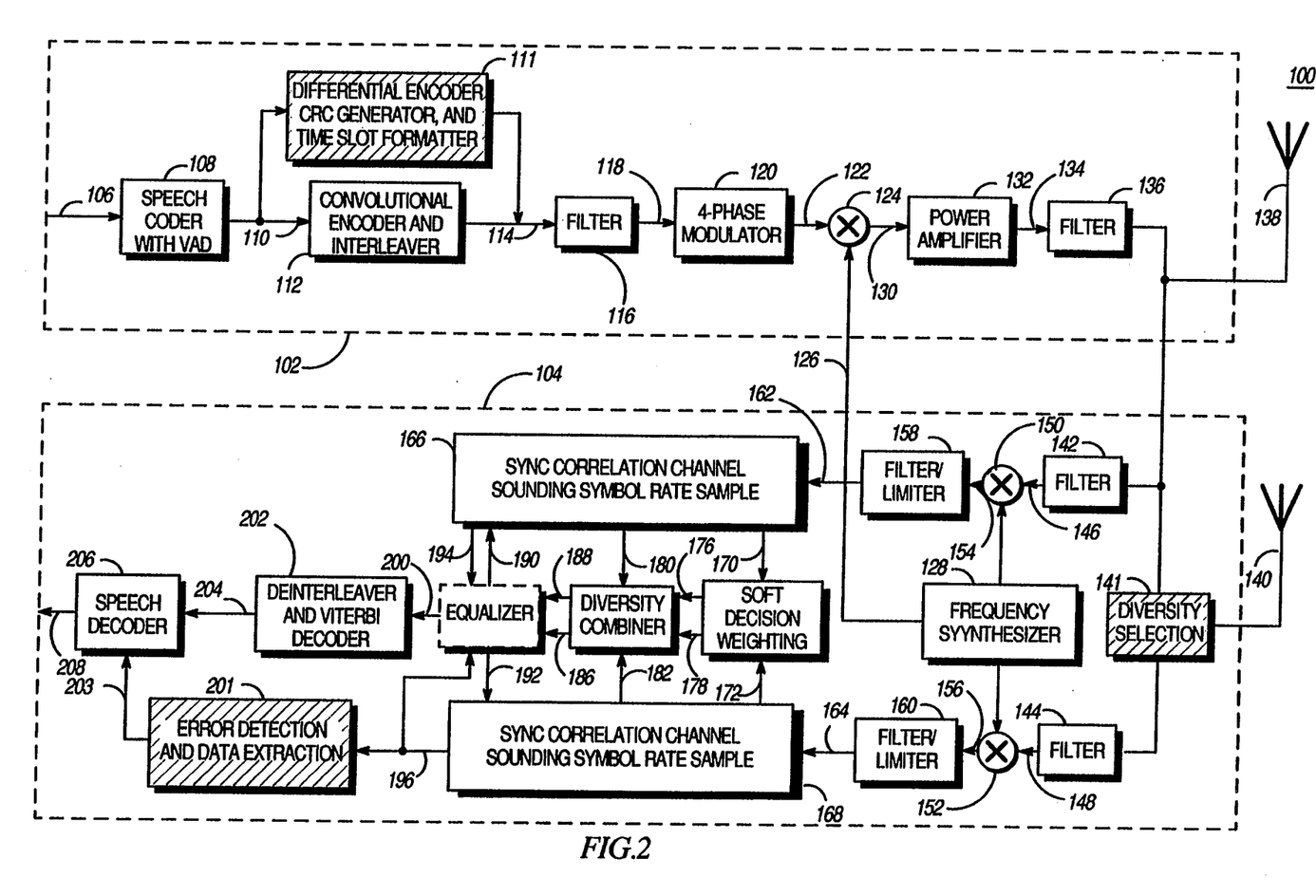

Referring now to FIG. 1 and FIG. 2, a preferred embodiment dual-tier PCS communication unit 100 is depicted in block diagram form. The dual-tier PCS communication unit 100 preferably is designed to operate as a communication unit in a low-tier (shown in FIG. 1) and a high-tier (shown in FIG. 2) PCS mode of operation. In addition, the dual-tier PCS communication unit 100 preferably is designed to share several logical components between the low-tier and high-tier communication unit so as to reduce complexity and cost of the overall communication unit. Further, dual-tier PCS communication unit 100 preferably includes mode selection circuitry which powers down or disables logical components which are not used for operating in one communication operational mode while the communication unit 100 is performing operations in the other communication operational mode. The disablement (e.g., powering down) unused circuitry causes significantly less current drain of the overall communication unit and as such prolongs the battery life of mobile/portable subscriber units which operate on batteries.

As shown, the communication unit 100 may be logically separated into transmitter 102 and receiver 104 function portions. It will be appreciated by those skilled in the art that although these communication functions have been logically separated, the actual implementation of these functions may be accomplished in a variety of different manners including, but not limited to properly programming a digital signal processor (DSP), coupling discrete components together, and using a combination of one or more application specific integrated chips (ASICs).

Referring now more specifically to FIG. 1, a preferred embodiment dual-tier communication unit operating as a low-tier communication unit is shown. A operating mode selection device (not shown) has disabled communication unit components 112, 142, 150, 158, 166, 174, 184, 198, and 202 which are not used in low-tier communication mode. The operating mode selection device may be implemented as a micro controller which sends enable and disable signals to various communication unit components. Alternatively, a digital signal processor may be controlled by software to perform only certain functions in each operational mode. However, it will be appreciated by those skilled in the art that several other techniques may be utilized to implement a mode selection device without departing from the scope and spirit of the present invention.

The transmitter portion 102 receives an information signal 106. The information signal 106 may contain data or digitized speech. In the case that the information signal 106 contains digitized speech, the information signal 106 is processed by a speech coder 108 to further encode the digitized speech. Preferably this speech coder employs a voice activity detection (VAD) mechanism to minimize the number of encoded data bits 110 which represent the digitized speech. In the alternative, if the information signal 106 contains data, then the data is passed through the speech coder 108 as the encoded data bits 110.

These encoded data bits 110 are subsequently coded 111 with error detection codes. In the preferred transmitter portion 102 design, the data bits 110 are differentially encoded and encoded with a cyclic redundancy code (CRC). The length of the CRC is chosen such that it will reliably detect errors while not becoming computationally burdensome. The complexity of the code may be tailored to the particular hardware implementation. In addition, the dual-tier PCS transceiver 100 may optionally utilize selective application of CRC in error detection coding. After coding, a known synchronization preamble is added 112 to the data bit stream, and the data bit stream is formatted for time division multiple access (TDMA) transmission. Subsequently, the data bit stream 114 is filtered by a full raised cosine filter 116 with a rolloff factor of 0.5 to meet bandwidth and intersymbol interference requirements.

This filtered data bit stream 118 preferably is subsequently four-phase modulated 120 (i.e., quadrature phase shift keying (QPSK) modulated). The four-phase modulated data bit stream 122 preferably is provided to one input of mixer 124 and a TDMA carrier signal 126 is provided to the other input of mixer 124. The TDMA carrier signal 126 preferably is generated by a frequency synthesizer 128 which generates a carrier signal within a predetermined RF band and time slot. The mixed TDMA signal 130 is subsequently amplified by power amplifier 132, supplied 134 to a final stage filter 136 and radiated by antenna 138 over a communication channel.

The receiver portion 104 is designed to efficiently detect and decode the transmitted signal. In view of the fading and multipath channels which are prevalent in mobile communications, a diversity selection receiver is employed to improve performance. At the receiver 104, a diversity selection device 141 receives signals from a first 138 and second 140 antenna and outputs one of the two signals to filter 144. The selection device preferably will determine which of the two signals to output by measuring the channel quality in previously received signal time slots (e.g., two time slots) on each antenna 138, 140 and selected the better signal. It will be appreciated by those skilled in the art that the channel quality can be measured with several parameters including bit error rates, interference in the signal, signal power, and etc.

Filters 144 and down converts 152 the received signal to a low IF frequency of approximately four megahertz. The frequency synthesizer 128 is used within the down conversion process 152 to follow the TDMA signal. At this point the signal 156 is hard limited 160. This feature eliminates the need for any form of automatic gain control (AGC) and greatly reduces the required resolution of the analog to digital (ND) converter and the size of the data paths required in the digital portion of the receiver 104.

Following the RF and IF processing, the low IF signal is bandpass sampled and converted to the digital domain 160. A relatively low cost A/D converter preferably samples at sixteen times the symbol rate and has only four bits of resolution. Four bit quantization can be used, because the earlier hard limiting 160 has removed the magnitude of the four-phase waveform. At this point, additional filtering is performed by low complexity (e.g., three to five taps) digital bandpass filters to eliminate direct current (DC) power offsets, reduce sampling noise, and separate the inphase and quadrature branches. The processed signal may then be decimated 160 by a factor of four effecting a translation to baseband of the hard-limited data samples. The translation to baseband can be readily performed, because the careful selection of a low IF frequency allows the communication unit 100 to utilize the image frequencies.

Now the processed signal is correlated 168 with the known predetermined synchronization word to determine the optimum sampling point and to perform carder recovery. Preferably the transmitted signal structure has the synchronization word inserted before the data such that the correlation 168 can be performed with only minimal buffering of the received signal 164. The largest correlation magnitude can serve as an estimate of the channel gain, and the phase of this correlation reflects the conjugate of the phase correction required by the signal 164. Once the largest correlation has been determined, the data samples are further decimated to single sample per symbol. Preferably, the dual-tier communication unit 100 actually performs very little processing with oversampled digital data. This allows the receiver portion 104 to minimize power consumption, memory storage and cost.

Following the correlation process 168, the data sample stream 196 is has the data samples extracted and decoded 201. At this point, the error detection code (e.g., cyclic redundancy check (CRC) code ) may optionally be used 201 to check for errors over the span of the code's input. The decoded bits 203, along with the CRC-derived erasure information, preferably is then output as data 208 or input to the speech decoder 206 and then output as voice 208.

Referring now more specifically to FIG. 2, a preferred embodiment dual-tier communication unit operating as a high-tier communication unit is shown. A operating mode selection device (not shown) has disabled communication unit components 111, 141, and 201 which are not used in high-tier communication mode.

The transmitter portion 102 receives an information signal 106. The information signal 106 may contain data or digitized speech. In the case that the information signal 106 contains digitized speech, the information signal 106 is processed by a speech coder 108 to further encode the digitized speech. Preferably this speech coder employs a voice activity detection (VAD) mechanism to minimize the number of encoded data bits 110 which represent the digitized speech. In the alternative, if the information signal 106 contains data, then the data is passed through the speech coder 108 as the encoded data bits 110.

These encoded data bits are subsequently coded 112 with error detection and error correction codes. In the preferred transmitter portion 102 design, a cyclic redundancy code (CRC)is used for error detection, and a convolutional code is used for forward error correction. The length of the CRC is chosen such that it will reliably detect errors while not becoming computationally burdensome. A similar strategy is followed in choosing the constraint length of the convolutional codes. The complexity of the code may be tailored to the particular hardware implementation. In addition, the dual-tier PCS transceiver 108 may optionally utilize non uniform coding rates and selective application of CRC in error detection coding.

After coding, the data bit stream is interleaved 112 to disperse transmission errors of a single frequency hop over a larger period. The dual-tier communication unit 108 preferably implements a convolutional interleaver, because this structure results in a dispersion of channel errors which is superior to a block interleaver having twice the amount of interleaving delay. By choosing the vertical dimension of the interleaver to be evenly divisible into the number of interleaved symbols transmitted within a frequency hopping slot, the interleaver has been structured in a manner which will allow synchronization even if a slot is dropped. A known synchronization preamble is added 112 to the interleaver output, and the data bit stream 114 is formatted for time division multiple access (TDMA) transmission. The data bit stream 114 is filtered by a full raised cosine filter 116 with a rolloff factor of 0.5 to meet bandwidth and intersymbol interference requirements.

This filtered data bit stream 118 preferably is subsequently four-phase modulated 120 (i.e., quadrature phase shift keying (QPSK) modulated). The four-phase modulated data bit stream 122 preferably is provided to one input of mixer 124 and a frequency hopping carrier signal 126 is provided to the other input of mixer 124. The frequency hopping carrier signal 126 preferably is generated by a frequency synthesizer 128 which generates a carrier signal within a predetermined RF band that hops according to a predetermined pattern (i.e., the frequency hop synthesizer 128 steps through the frequency hopping code ). The mixed frequency hopping signal 130 is subsequently amplified by power amplifier 132, supplied 134 to a final stage filter 136 and radiated by antenna 138 over a communication channel.

It will be appreciated by those skilled in the art that the predetermined RF band does not have to be a contiguous frequency band, but rather only need be within a specific range of frequencies to which the chosen frequency synthesizer is capable of operating. In addition, the predetermined pattern (i.e., hopping code) is used to determine the sequence in which a particular communication unit is to hop over the RF band such that the communication unit causes minimal interference to other communication units operating in the same multiple access communication system. Further, it will be appreciated that frequency hop transmission is employed to help mitigate channel impediments such as slow fading. Furthermore, the use of frequency hopping provides another form of diversity to the high-tier communication system and results in the system performance being independent of a user's speed (e.g., if a user is traveling in a vehicle).

The receiver portion 104 is designed to efficiently detect and decode the transmitted signal. In view of the fading and multipath channels which are prevalent in mobile communications, a diversity combining receiver is employed to improve performance. At the receiver 104, a diversity selection device 141 receives signals from a first 138 and second 140 antenna. However, since it is not used in the high-tier operational mode, only the signal received by antenna 140 is output to filter 144.

Each diversity branch (i.e. first branch 138, 142, 146, 150, 154, 158, 162, and 166 as well as second branch 140, 144, 148, 152, 156, 160, 164, and 168) first filters 142, 144 and down converts 150, 152 its respective received signal to a low IF frequency of approximately four megahertz. The frequency synthesizer 128 is used within the down conversion process 150, 152 to follow the hopping signal. At this point the signal 154, 156 is hard limited 158, 160. This feature eliminates the need for any form of automatic gain control (AGC) and greatly reduces the required resolution of the analog to digital (ND) converter and the size of the data paths required in the digital portion of the receiver 104.

Following the RF and IF processing, the low IF signal is bandpass sampled and converted to the digital domain 158, 160. A relatively low cost A/D converter preferably samples at sixteen times the symbol rate and has only four bits of resolution. Four bit quantization can be used, because the earlier hard limiting 158, 160 has removed the magnitude of the four-phase waveform. At this point, additional filtering is performed by low complexity (e.g., three to five taps) digital bandpass filters to eliminate DC offsets, reduce sampling noise, and separate the inphase and quadrature branches. Each branch may then be decimated 158, 160 by a factor of four effecting a translation to baseband of the hard-limited data samples. The translation to baseband can be readily performed, because the careful selection of a low IF frequency allows the communication unit 100 to utilize the image frequencies.

Now each branch is correlated 166, 168 with the known predetermined synchronization word to determine the optimum sampling point and to perform carder recovery. Preferably the transmitted signal structure has the synchronization word inserted before the data such that the correlation 166, 168 can be performed with only minimal buffering of the received signal 162, 164. The largest correlation magnitude can serve as an estimate of the channel gain, and the phase of this correlation reflects the conjugate of the phase correction required by the signal 162, 164. Once the largest correlation has been determined, the data samples are further decimated to single sample per symbol. Preferably, the high-tier communication unit 100 actually performs very little processing with oversampled digital data. This allows the receiver portion 104 to minimize power consumption, memory storage and cost.

Next, a signal quality estimate, or weighting parameter 176, 178, is calculated 174 for each branch 170, 172, and the branches 180, 182 are diversity combined 184. Within this process, the scaling 176, 178 required for soft decision decoding 202 is also applied 184 to the signal 180, 182. While it is possible to use a variety of weighting parameters, the best performance will be obtained from a ratio-based statistic. The ability of the high-tier communication unit 100 to compute a ratio-based statistic allows the successful calculation of soft information despite the presence of the hard limiter 158, 160.

As FIG. 1 indicates, an equalizer 198 is a possible receiver portion 104 option. Such an equalizer 198 would require input 194, 196 from each branch as well as the output 186 of diversity combiner 194. In addition, in order for the equalizer 198 to perform optimally, the equalizer 198 would need to output fine tuning adjustment information to each branch 190, 192 as well as the diversity combiner 188. Subsequently, the equalized combined data sample stream would be output 200 to the deinterleaver 202. While the high-tier PCS operational mode does not exclude the use of an equalizer 198, preliminary results indicate that its use results in only a small performance improvement relative to a system employing only frequency-hopping and diversity.

Following the weighting and combining process 184, the data sample stream 186, 200 is convolutionally deinterleaved 202. The deinterleaver output is Viterbi decoded 202 in an attempt to correct the errors introduced by the communication channel. At this point, the error detection code (e.g., cyclic redundancy check (CRC) code) may optionally be used 202 to check for errors over the span of the code's input. The decoded bits 204, along with the CRC-derived erasure information, preferably is then output as data 208 or input to the speech decoder 206 and then output as voice 208.

Figure 3:
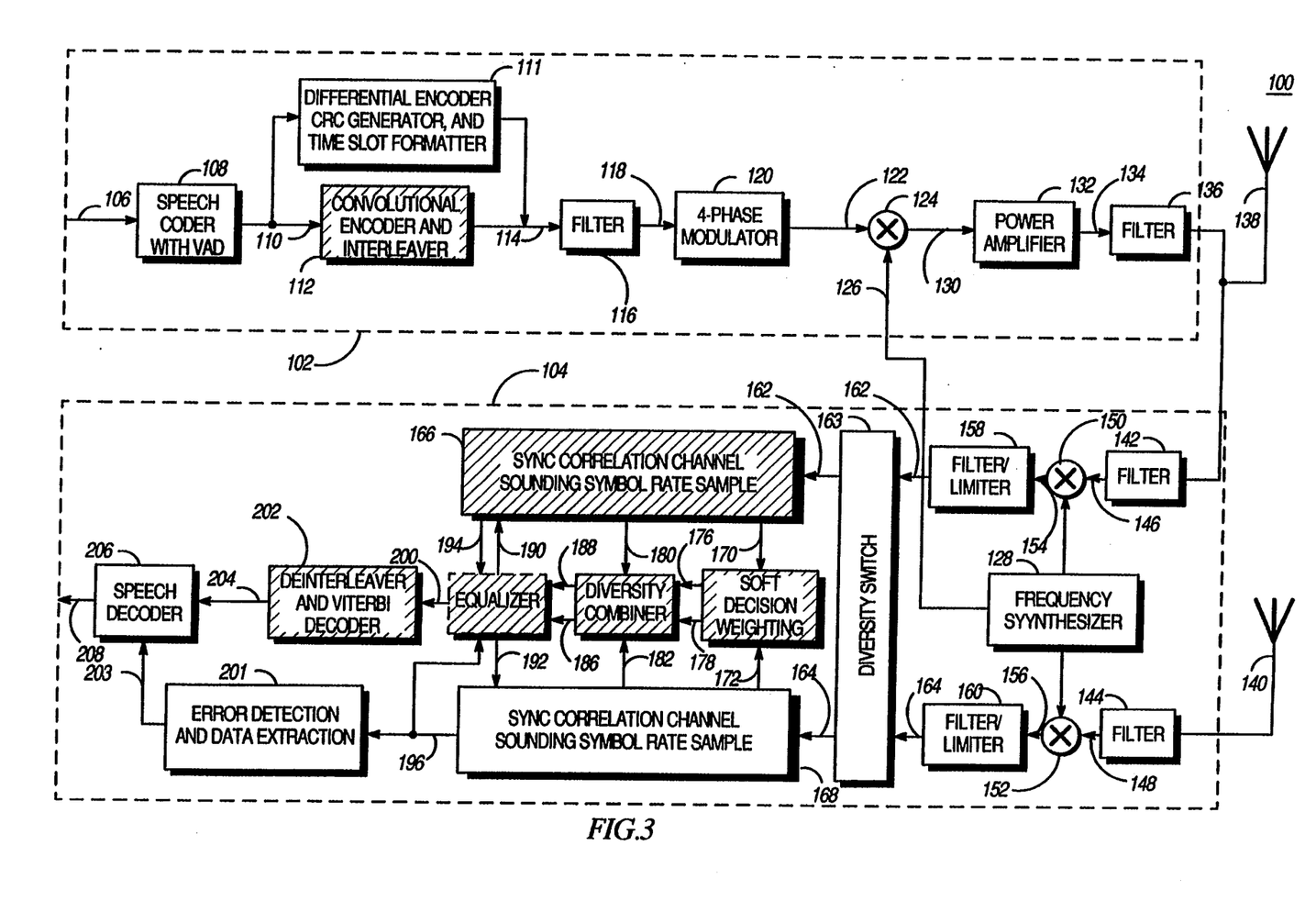
FIG. 3, 4 are diagrams showing an alternative preferred embodiment digital cellular radio communication unit for operation in a first and a second mode, respectively.
Figure 4:
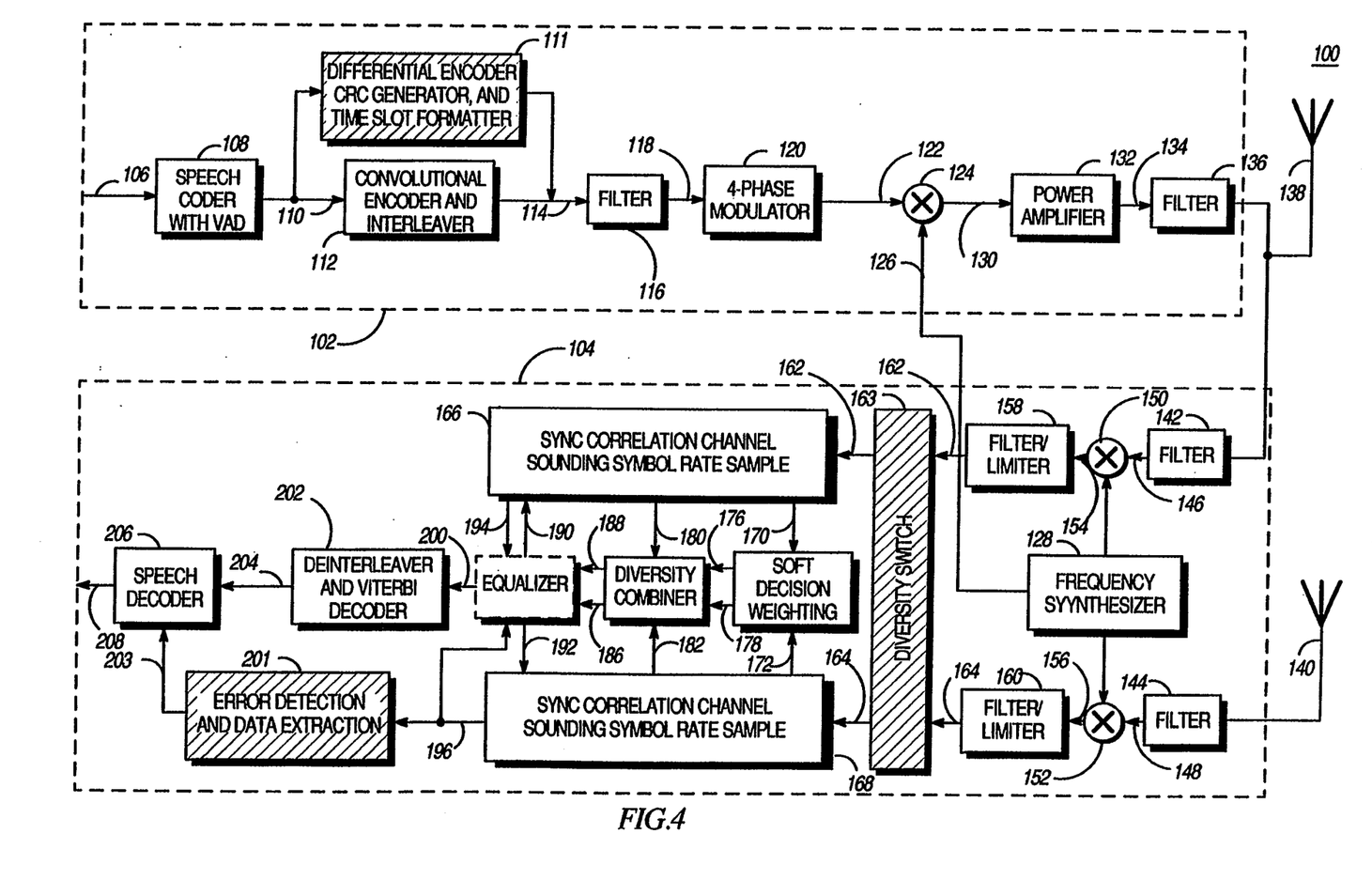

An alternative preferred embodiment dual-tier communication unit 100 to the one depicted in FIG. 1 and FIG. 2 is shown in FIG. 3 and FIG. 4. This alternative preferred embodiment dual-tier communication unit operates substantially as was described in reference to FIG. 1 and FIG. 2. However, the position of the diversity selection device 163 relative to the other receiver portion 104 components has been changed. In this position, the diversity selection device 163 may potentially have better channel quality information to use in the determining process, than the diversity selection device 143 (shown in FIG. 1) may have due to it's relative position in the receiver portion 104.

Referring now more specifically to FIG. 3, a dual-tier communication unit operating as a low-tier communication unit is shown. The dual-tier communication unit operates substantially as described with reference to FIG. 1 except for the following. The operating mode selection device (not shown) has disabled communication unit components 112, 166, 174, 184, 198, and 202 which are not used in low-tier communication mode. Each diversity branch (i.e. first branch 138, 142, 146, 150, 154, and 158 as well as second branch 140, 144, 148, 152, 156, and 160) first filters 142, 144 and down converts 150, 152 its respective received signal to a low IF frequency of approximately four megahertz. The frequency synthesizer 128 is used within the down conversion process 150, 152 to follow the TDMA signal. At this point the signal 154, 156 is hard limited 158, 160. Following the RF and IF processing, the low IF signal is bandpass sampled and converted to the digital domain 158, 160. Further, additional filtering is performed to eliminate DC offsets, reduce sampling noise, and separate the inphase and quadrature branches. Each branch may then be decimated 158, 160 by a factor of four effecting a translation to baseband of the hard-limited data samples. Now the diversity selection device 163 receives the hard-limited data samples 162, 164 and outputs 164' one of the two signals to be correlated 168 which corresponds to the channel branch having the better channel quality.

Referring now more specifically to FIG. 4, a dual-tier communication unit operating as a high-tier communication unit is shown. The dual-tier communication unit operates substantially as described with reference to FIG. 2 except for the following. The operating mode selection device (not shown) has disabled communication unit components 111, 163 and 201 which are not used in high-tier communication mode. In addition, the diversity selection device 163 receives signals 162 and 164. However, since the diversity selection device 163 is not used in the high-tier operational mode, the signals 162, 164 are passed through and output 162', 164', respectively, to their respective correlation circuitry.

Figure 5:
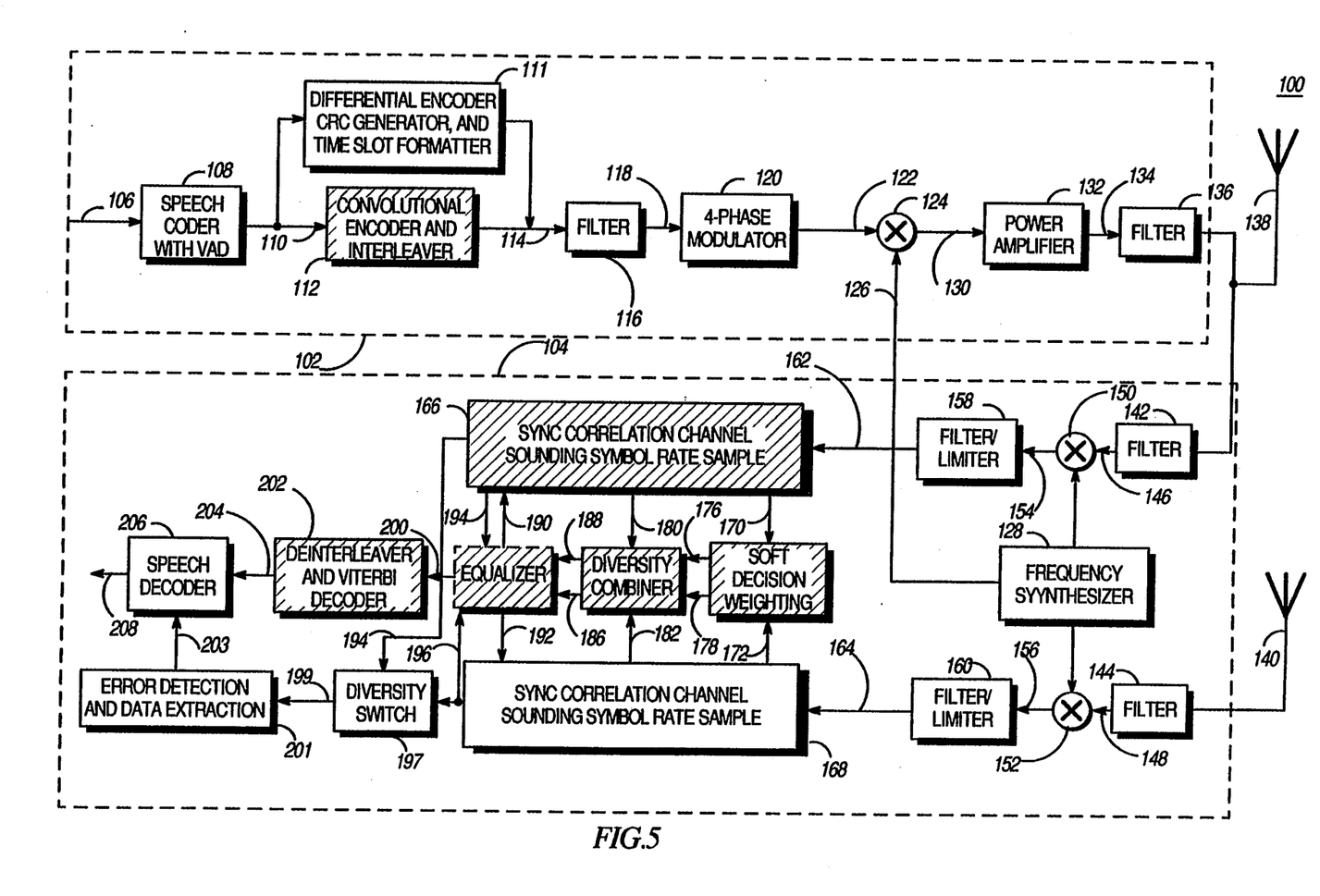
FIG. 5, 6 are diagrams showing another alternative preferred embodiment digital cellular radio communication unit for operation in a first and a second mode, respectively.

Another alternative preferred embodiment dual-tier communication unit 100 to the one depicted in FIG. 1 and FIG. 2 is shown in FIG. 5 and FIG. 5. This alternative preferred embodiment dual-tier communication unit operates substantially as was described in reference to FIG. 1 and FIG. 2. However, the position of the diversity selection device 197 relative to the other receiver portion 104 components has been changed. In this position, the diversity selection device 197 may potentially have better channel quality information to use in the determining process, than the diversity selection device 143 (shown in FIG. 1) and the diversity selection device 163 (shown in FIG. 3) may have due to it's relative position in the receiver portion 104. As a design tradeoff, however, this alternative dual-mode communication unit 100 requires more receiving components to be enabled during low-tier operation than the communication unit 100 shown in FIG. 1.

Referring now more specifically to FIG. 5, a dual-tier communication unit operating as a low-tier communication unit is shown. The dual-tier communication unit operates substantially as described with reference to FIG. 1 except for the following. The operating mode selection device (not shown) has disabled communication unit components 112, 166, 174, 184, 198, and 202 which are not used in low-tier communication mode. Each diversity branch (i.e. first branch 138, 142, 146, 150, 154, and 158 as well as second branch 140, 144, 148, 152, 156, and 160) first filters 142, 144 and down converts 150, 152 its respective received signal to a low IF frequency of approximately four megahertz. The frequency synthesizer 128 is used within the down conversion process 150, 152 to follow the TDMA signal. At this point the signal 154, 158 is hard limited 158, 160. Following the RF and IF processing, the low IF signal is bandpass sampled and converted to the digital domain 158, 160. Further, additional filtering is performed to eliminate DC offsets, reduce sampling noise, and separate the inphase and quadrature branches. Each branch may then be decimated 158, 160 by a factor of four effecting a translation to baseband of the hard-limited data samples. Now each branch is correlated 168, 168 with the known predetermined synchronization word to determine the optimum sampling point and to perform carrier recovery. Once the correlation has been determined, the data samples are further decimated to single sample per symbol. Following the correlation process 166, 168, the diversity selection device 197 receives the symbol rate data samples 194, 196 and outputs 199 one of the two signals (i.e., the signal which corresponds to the channel branch having the better channel quality) to have data samples extracted and decoded 201.

Figure 6:
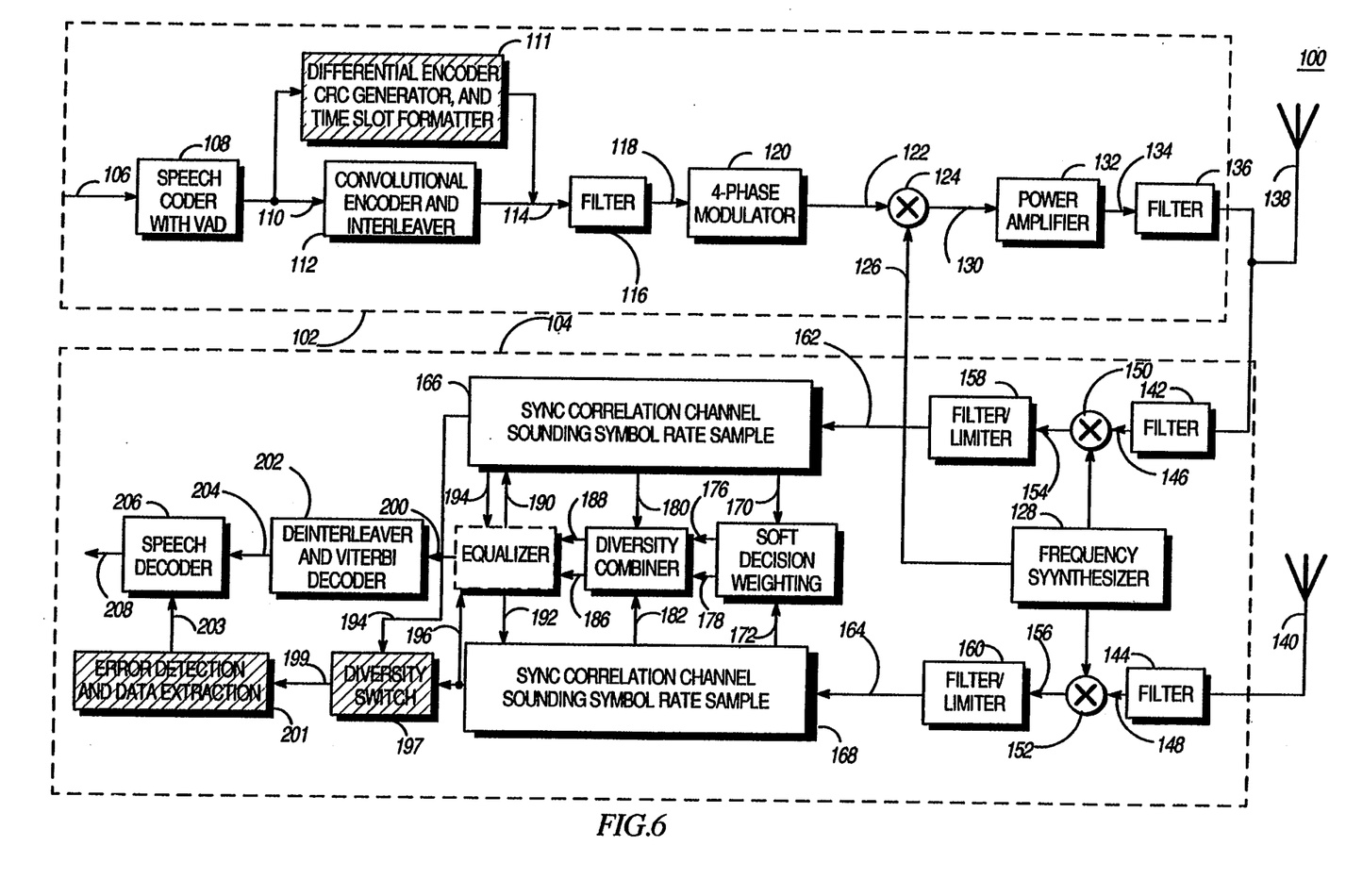

Referring now more specifically to FIG. 6, a dual-tier communication unit operating as a high-tier communication unit is shown. The dual-tier communication unit operates substantially as described with reference to FIG. 2 except for the following. The operating mode selection device (not shown) has disabled communication unit components 111, 197 and 201 which are not used in high-tier communication mode.

Alternatively, the preferred embodiment dual mode digital radio communication unit 100 shown in FIG. 1 through FIG. 6 can be described as follows. A dual mode digital radio communication unit 100 for a digital communication system is provided. The communication unit 100 includes a transmitter portion 102 for transmitting an encoded input information signal 106 over a radio communication channel. The transmitter portion 102 includes a data bit coder 108 for encoding an input information signal 106 into a data bit stream 110. An error controller 111, 112 is operatively coupled to the data bit coder 108 for generating a transmission error protected data bit stream 114. The error controller includes the following two transmission protection apparatus: (1) a cyclic redundancy check generator 111 for encoding the data bit stream 110 and (2) a forward error correction device 112 for convolutionally encoding and interleaving the data bit stream 110. A synchronizer is operatively coupled to the error controller for inserting a predetermined synchronization sequence into the error protected data bit stream 114.

A multi-phase modulator 120 is operatively coupled to the synchronizer for generating a multi-phase intermediate signal 122 through the use of the synchronization sequence inserted and error protected data bit stream 114. A frequency translator 124 is operatively coupled to the multi-phase modulator 120 for generating a radio frequency encoded input information signal 130 by combining the intermediate signal 122 with a radio communication channel selecting signal 126 generated by a frequency synthesizer 128. The frequency synthesizer 128 operates in one of two particular modes of operation including: (1) a non-frequency hopping time division multiple access mode and (2) a frequency hopping code division multiple access mode. A mode selector (not shown) is operatively coupled to the error controller 111, 112 for enabling one of (1) the transmission protection apparatus cyclic redundancy check generator 111 and (2) the transmission protection apparatus forward error correction device 112 for use with a particular mode of operation such that the transmission protection apparatus which are not used in the selected particular mode of operation are disabled.

The communication unit 100 also includes a receiver portion 104 for receiving the encoded input information signal from over the radio communication channel. The receiver portion 104 includes a demodulator 150, 152 for generating a first 154 and a second 158 group of data samples of the received signal corresponding to a signal received at a first 138 and a second 140 antenna, respectively, through the use of a radio communication channel selecting signal generated by a frequency synthesizer 128. The frequency synthesizer 128 operates in one of two particular modes of operation including: (1) a non-frequency hopping time division multiple access mode and (2) a frequency hopping code division multiple access mode.

A hard limiter 158, 160 is operatively coupled to the demodulator 150, 152 for hard limiting the first 154 and second 156 group of data samples by removing the magnitude of each sample in the first 154 and the second 156 group of data samples. A frequency translator 158, 160 is operatively coupled to the hard limiter 158, 160 for translating a subset of the hard-limited data samples of the first 154 and the second 156 group to baseband frequencies by decimating each group of data samples in a time domain.

A correlator 166, 168 is operatively coupled to the frequency translator 158, 160 for correlating the subset of the hard-limited data samples of the first 162 and the second 164 group of data samples to a known predetermined synchronization sequence so as to independently determine an optimal sampling point for each group of data samples and to generate symbol rate data samples of each group.

An error controller 174, 184, 201, 202 is operatively coupled to the correlator 166, 168 for generating estimated information signal samples 208 from the symbol rate data samples 180, 182 of each group according to an algorithm either (1) an error detection algorithm or (2) an error correction algorithm. The error detection algorithm includes: selecting one 196 of the first and the second groups of data samples corresponding to the antenna 138, 140 having a better estimated signal quality, performing 201 a cyclic redundancy check on the selected group of symbol rate data samples 196 and extracting 201 data bits from the selected group of symbol rate data samples 196. The error correction algorithm includes: generating 174 weighting coefficients 176, 178 for the data samples of the first 180 and the second 182 group, scaling 184 the first 180 and the second 182 group of symbol rate data samples, maximum ratio combining 184 the first 180 and the second 182 scaled symbol rate data samples into a stream of combined data samples 186, and deinterleaving 202 and maximum-likelihood decoding 202 the stream of combined data samples 186, 200 into estimated information samples 208.

Finally, mode selector (not shown) is operatively coupled to the demodulator 150, 152, hard limiter 158, 160, frequency translator 158, 160, correlator 166, 168, and error controller 174, 184, 201, 202, for receiving the received signal according to one of the error control algorithms associated with a particular mode of operation of the dual mode radio communication unit 100 such that the demodulator 160, 152, hard limiter 158, 160, frequency translator 158, 160, correlator 166, 168, and error controller 174, 184, 201, 202 associated with generating estimated information signal samples 208 according to the algorithm which is not used in the selected particular mode of operation are disabled.

In summary, the dual mode radio communication unit 100 offers several improvements over known technology. The techniques in communication system design which allow the shared use of several transmitter and receiver components offer large cost savings while minimizing complexity of communication circuitry and reduced power requirements over other dual mode communication unit designs.

Although the invention has been described and illustrated with a certain degree of particularity, it is understood that the present disclosure of embodiments has been made by way of example only and that numerous changes in the arrangement and combination of parts as well as steps may be resorted to by those skilled in the art without departing from the spirit and scope of the invention as claimed.

What is claimed is:

1. A dual mode radio communication unit for a digital communication system, comprising:
   (a) error control means for protecting an input information signal from transmission errors, the error control means comprising transmission protection apparatuses including: (i) an error detection means for encoding the input information signal into an error protected data bit stream and (ii) forward error correction means for encoding the input information signal into an error protected data bit stream; and
   (b) mode selection means, operatively coupled to the error control means, for enabling only one of the transmission protection apparatuses-(i) the error detection means and (ii) the forward error correction means for use with a particular mode of operation of the dual mode radio communication unit.

2. The dual mode radio communication unit of claim 1 wherein:
   (a) the error detection means comprises a cyclic redundancy check generating means for encoding the input information signal; and
   (b) the forward error correction means comprises means for convolutionally encoding and interleaving the input information signal.

3. The dual mode radio communication unit of claim 1 wherein the mode selection means comprises means for disabling the transmission protection apparatus not used in the selected particular mode of operation.

4. The dual mode radio communication unit of claim 1 further comprising:
   (a) data bit coding means, operatively coupled to the error control means, for encoding a input information signal into a data bit stream, the data bit stream being provided to the error control means for subsequent transmission protection encoding; and
   (b) synchronization means, operatively coupled to the error control means, for inserting a predetermined synchronization sequence into the error protected data bit stream.

5. The dual mode radio communication unit of claim 1 further comprising:
   (a) multi-phase modulating means, operatively coupled to the error control means, for generating a multi-phase intermediate signal through the use of the error protected information signal; and
   (b) frequency translation means, operatively coupled to the multi-phase modulating means, for generating a radio frequency transmission signal by combining the intermediate signal with a radio communication channel selecting signal generated by a frequency synthesizer, the frequency synthesizer operating in one of two particular modes of operation including: (i) non-frequency hopping time division multiple access mode and (ii) frequency hopping code division multiple access mode.

6. A dual mode radio communication unit for a digital communication system, comprising:
   (a) error control means for generating estimated information signal samples from a signal received over a radio communication channel according to an algorithm selected from the group consisting of (i) an error detection algorithm and (ii) an error correction algorithm; and
   (b) mode selection means, operatively coupled to the error control means, for receiving the received signal according to one of the group of algorithms associated with a particular mode of operation of the dual mode radio communication unit.

7. The dual mode radio communication unit of claim 6 wherein:
   (a) the means for generating estimated information signal samples according to the error detection algorithm comprises means for generating a first and a second group of data samples of the received signal corresponding to the signal received at the first and the second antenna, selecting one of the first and the second groups of data samples corresponding to the antenna having a better estimated signal quality, performing a cyclic redundancy check on the selected group of data samples and extracting data bits from the selected group of data samples; and
   (b) the means for generating estimated information signal samples according to the error correction algorithm comprises means for generating a first and a second group of data samples of the received signal corresponding to the signal received at the first and the second antenna, generating weighting coefficients for the data samples of the first and the second group, scaling the first and the second group of symbol rate data samples, maximum ratio combining the first and the second scaled symbol rate data samples into a stream of combined data samples, and deinterleaving and maximum-likelihood decoding the stream of combined data samples into estimated information samples.

8. The dual mode radio communication unit of claim 6 wherein the mode selection means comprises means for disabling the means for generating estimated information signal samples according to the algorithm not used in the selected particular mode of operation.

9. The dual mode radio communication unit of claim 6 further comprising:
   (a) demodulating means for generating a first and a second group of data samples of the received signal corresponding to a signal received at a first and a second antenna, respectively, through the use of a radio communication channel selecting signal generated by a frequency synthesizer, the frequency synthesizer operating in one of two particular modes of operation including: (i) non-frequency hopping time division multiple access mode and (ii) frequency hopping code division multiple access mode.
   (b) hard limiting means, operatively coupled to the demodulating means, for removing the magnitude of each sample in the first and the second group of data samples;
   (c) frequency translation means, operatively coupled to the limiting means, for translating a subset of the hard-limited data samples of the first and the second group to baseband frequencies by decimating the group of samples in the time domain; and
   (d) correlation means, operatively coupled to the frequency translation means, for correlating the subset of hard-limited data samples of the group of data samples to a known predetermined synchronization sequence to independently determine an optimal sampling point for the group of data samples to generate symbol rate data samples of the group, the correlation means providing the symbol rate data samples to the error control means when the error control means generates estimated information signal samples according to the error detection algorithm, the correlation means determines channel sounding information, generating weighting coefficients of the hard-limited symbol rate data samples of the first and the second group for diversity combining and maximum likelihood decoding, scaling the first and the second group of symbol rate data samples and maximum ratio combining the first and the second scaled symbol rate data samples into a stream of combined data samples, and providing the stream of combined symbol rate data samples to the error control means when the error control means generates estimated information signal samples according to the error correction algorithm.

10. A dual mode digital radio communication system, comprising:
  (a) transmitting means for transmitting an encoded input information signal over a radio communication channel, comprising:
    (i) error control means for protecting an input information signal from transmission errors, the error control means comprising transmission protection apparatuses including: (1) an error detection means for encoding the input information signal and (2) forward error correction means for encoding the input information signal; and
    (ii) mode selection means, operatively coupled to the error control means, for enabling only one of the transmission protection apparatuses for use with a particular mode of operation; and
  (b) receiving means for receiving the encoded input information signal from over the radio communication channel, comprising
    (i) error control means for generating estimated information signal samples from the signal received over radio communication channel according to an algorithm selected from the group consisting of (1) an error detection algorithm and (2) an error correction algorithm; and
    (ii) mode selection means, operatively coupled to the error control means, for receiving the received signal according to only one of the error control algorithms associated with a particular mode of operation of the dual mode radio communication unit.

11. The dual mode radio communication system of claim 10 wherein:
  (a) the transmitting means error detection means comprises a cyclic redundancy check generating means for encoding the input information signal; and
  (b) the transmitting means forward error correction means comprises means for convolutionally encoding and interleaving the input information signal.

12. The dual mode radio communication system of claim 10 wherein the transmitting means mode selection means comprises means for disabling the transmission protection apparatuses not used in the selected particular mode of operation.

13. The dual mode radio communication system of claim 10 wherein the transmitting means further comprises:
  (a) data bit coding means, operatively coupled to the error control means, for encoding an input information signal into a data bit stream, the data bit stream being provided to the error control means for subsequent transmission protection encoding; and
  (b) synchronization means, operatively coupled to the error control means, for inserting a predetermined synchronization sequence into the error protected data bit stream.

14. The dual mode radio communication system of claim 10 wherein the transmitting means further comprises:
  (a) multi-phase modulating means, operatively coupled to the error control means, for generating a multi-phase intermediate signal through the use of the error protected information signal; and
  (b) frequency translation means, operatively coupled to the multi-phase modulating means, for generating a radio frequency transmission signal by combining the intermediate signal with a radio communication channel selecting signal generated by a frequency synthesizer, the frequency synthesizer operating in one of two particular modes of operation including: (i) non-frequency hopping time division multiple access mode and (ii) frequency hopping code division multiple access mode.

15. The dual mode radio communication system of claim 10 wherein:
  (a) the receiving means error detection algorithm comprises means for generating a first and a second group of data samples of the received signal corresponding to the signal received at the first and the second antenna, selecting one of the first and the second groups of data samples corresponding to the antenna having a better estimated signal quality, performing a cyclic redundancy check on the selected group of data samples and extracting data bits from the selected group of data samples; and
  (b) the receiving means error correction algorithm comprises means for generating a first and a second group of data samples of the received signal corresponding to the signal received at the first and the second antenna, generating weighting coefficients for the data samples of the first and the second group, scaling the first and the second group of symbol rate data samples, maximum ratio combining the first and the second scaled symbol rate data samples into a stream of combined data samples, and deinterleaving and maximum-likelihood decoding the stream of combined data samples into estimated information samples.

16. The dual mode radio communication unit of claim 10 wherein the receiving means mode selection means comprises means for disabling the error control means for generating estimated information signal samples according to the algorithm not used in the selected particular mode of operation.

17. The dual mode radio communication unit of claim 10 wherein the receiving means further comprises:
  (a) demodulating means for generating a first and a second group of data samples of the received signal corresponding to a signal received at a first and a second antenna, respectively, through the use of a radio communication channel selecting signal generated by a frequency synthesizer, the frequency synthesizer operating in one of two particular modes of operation including: (i) non-frequency hopping time division multiple access mode and (ii) frequency hopping code division multiple access mode,
(b) hard limiting means, operatively coupled to the demodulating means, for removing the magnitude of each sample in the first and the second group of data samples;
(c) frequency translation means, operatively coupled to the limiting means, for translating a subset of the hard-limited data samples of the first and the second group to baseband frequencies by decimating the group of samples in the time domain; and
(d) correlation means, operatively coupled to the frequency translation means, for correlating the subset of hard-limited data samples of the first and the second group of data samples to a known predetermined synchronization sequence to independently determine an optimal sampling point for each group of data samples to generate symbol rate data samples of each group, the correlation means providing the symbol rate data samples to the error control means when the error control means generates estimated information signal samples according to the error detection algorithm, the correlation means determines channel sounding information, generating weighting coefficients of the hard-limited symbol rate data samples of the first and the second group for diversity combining and maximum likelihood decoding, scaling the first and the second group of symbol rate data samples and maximum ratio combining the first and the second scaled symbol rate data samples into a stream of combined data samples, and providing the stream of combined symbol rate data samples to the error control means when the error control means generates estimated information signal samples according to the error correction algorithm.

18. A dual mode digital radio communication system, comprising:
    (a) transmitting means for transmitting an encoded input information signal over a radio communication channel, comprising:
        (i) data bit coding means for encoding an input information signal into a data bit stream;
        (ii) error control means, operatively coupled to the data bit coding means, for generating a transmission error protected data bit stream, the error control means comprising a transmission protection apparatus including (1) a cyclic redundancy check generating means for encoding the data bit stream and (2) a forward error correction means for convolutionally encoding and interleaving the data bit stream;
        (iii) synchronization means, operatively coupled to the error control means, for inserting a predetermined synchronization sequence into the error protected data bit stream;
        (iv) multi-phase modulating means, operatively coupled to the synchronization means, for generating a multi-phase intermediate signal through the use of the synchronization sequence inserted and error protected data bit stream;
        (v) frequency translation means, operatively coupled to the multi-phase modulating means, for generating a radio frequency encoded input information signal by combining the intermediate signal with a radio communication channel selecting signal generated by a frequency synthesizer, the frequency synthesizer operating in one of two particular modes of operation including: (1) a non-frequency hopping time division multiple access mode and (2) a frequency hopping code division multiple access mode; and
        (iv) mode selection means, operatively coupled to the error control means, for enabling only one of (1) the transmission protection apparatus cyclic redundancy check generating means and (2) the transmission protection apparatus forward error correction means for use with a particular mode of operation such that the transmission protection apparatus which are not used in the selected particular mode of operation are disabled; and
    (b) receiving means for receiving the encoded input information signal from over the radio communication channel, comprising
        (i) demodulating means for generating a first and a second group of data samples of the received signal corresponding to a signal received at a first and a second antenna, respectively, through the use of a radio communication channel selecting signal generated by a frequency synthesizer, the frequency synthesizer operating in one of two particular modes of operation including: (1) a non-frequency hopping time division multiple access mode and (1) a frequency hopping code division multiple access mode;
        (ii) hard limiting means, operatively coupled to the demodulating means, for hard limiting the first and second group of data samples by removing the magnitude of each sample in the first and the second group of data samples;
        (iii) frequency translation means, operatively coupled to the hard limiting means, for translating a subset of the hard-limited data samples of the first and the second group to baseband frequencies by decimating each group of data samples in a time domain;
        (iv) correlation means, operatively coupled to the frequency translation means for correlating the subset of the hard-limited data samples of the first and the second group of data samples to a known predetermined synchronization sequence so as to independently determine an optimal sampling point for each group of data samples and to generate symbol rate data samples of each group;
        (v) error control means, operatively coupled to the correlation means for generating estimated information signal samples from the symbol rate data samples of each group according to an algorithm selected from the group consisting of (1) an error detection algorithm and (2) an error correction algorithm, the error detection algorithm comprises selecting one of the first and the second groups of data samples corresponding to the antenna having a better estimated signal quality, performing a cyclic redundancy check on the selected group of symbol rate data samples and extracting data bits from the selected group of symbol rate data samples, the error correction algorithm comprises, generating weighting coefficients for the data samples of the first and the second group, scaling the first and the second group of symbol rate data samples, maximum ratio combining the first and the second scaled symbol rate data samples into a stream of combined data samples, and deinterleaving and maximum-likelihood decoding the stream of combined data samples into estimated information samples; and (vi) mode selection means, operatively coupled to the demodulating means, hard limiting means, frequency translation means, correlation means, and error control means, for receiving the received signal according to one of the error control algorithms associated with a particular mode of operation of the dual mode radio communication unit such that the demodulating means, hard limiting means, frequency translation means, correlation means, and error control means associated with generating estimated information signal samples according to the algorithm which is not used in the selected particular mode of operation are disabled.

* * * * *